United States Patent
Song et al.

(10) Patent No.: US 8,314,551 B2
(45) Date of Patent: Nov. 20, 2012

(54) ORGANIC LIGHT EMITTING DISPLAY DEVICE AND METHOD OF MANUFACTURING THEREOF

(75) Inventors: Seung-Yong Song, Suwon-si (KR); Young-Seo Choi, Suwon-si (KR); Oh-June Kwon, Suwon-si (KR); Young-Cheol Joo, Suwon-si (KR); Sun-Young Jung, Suwon-si (KR); Ji-Hun Ryu, Suwon-si (KR)

(73) Assignee: Samsung Display Co., Ltd. (KR)

( * ) Notice: Subject to any disclaimer, the term of this patent is extended or adjusted under 35 U.S.C. 154(b) by 306 days.

(21) Appl. No.: 12/220,655

(22) Filed: Jul. 25, 2008

(65) Prior Publication Data
US 2009/0195147 A1    Aug. 6, 2009

(30) Foreign Application Priority Data
Feb. 1, 2008    (KR) .................... 10-2008-0010756

(51) Int. Cl.
*H01L 51/50*    (2006.01)
*H01L 51/52*    (2006.01)
*H01L 51/54*    (2006.01)

(52) U.S. Cl. ......... 313/512; 313/504; 313/506; 313/509

(58) Field of Classification Search ........... 313/498–512
See application file for complete search history.

(56) References Cited

U.S. PATENT DOCUMENTS

| | | | |
|---|---|---|---|
| 6,603,254 B1 * | 8/2003 | Ando ............................ 313/495 |
| 6,605,893 B2 * | 8/2003 | Ando ............................ 313/495 |
| 6,791,660 B1 * | 9/2004 | Hayashi et al. ............... 349/190 |
| 6,878,467 B2 * | 4/2005 | Chung et al. .................. 428/690 |
| 7,431,628 B2 * | 10/2008 | Park et al. ....................... 445/25 |
| 7,545,094 B2 * | 6/2009 | Choi et al. ..................... 313/504 |
| 7,800,303 B2 * | 9/2010 | Logunov et al. .............. 313/512 |
| 2001/0013756 A1 * | 8/2001 | Mori et al. .................... 313/512 |
| 2002/0057565 A1 * | 5/2002 | Seo ................................ 362/84 |
| 2003/0066311 A1 * | 4/2003 | Li et al. ........................... 65/43 |
| 2003/0122476 A1 * | 7/2003 | Wang et al. ................... 313/493 |
| 2004/0069017 A1 * | 4/2004 | Li et al. ........................... 65/43 |
| 2005/0046344 A1 * | 3/2005 | Lee et al. ....................... 313/504 |
| 2006/0132034 A1 * | 6/2006 | Cho et al. ...................... 313/512 |
| 2007/0090759 A1 * | 4/2007 | Choi et al. ..................... 313/512 |
| 2007/0170849 A1 * | 7/2007 | Park ............................... 313/506 |
| 2008/0136980 A1 * | 6/2008 | Rho et al. ........................ 349/12 |
| 2010/0194267 A1 * | 8/2010 | Forrest et al. ................. 313/504 |
| 2011/0278145 A1 * | 11/2011 | Takeda et al. ................. 200/314 |

FOREIGN PATENT DOCUMENTS

JP    2002280169 A  *  9/2002

(Continued)

*Primary Examiner* — Nimeshkumar Patel
*Assistant Examiner* — Jose M Diaz
(74) *Attorney, Agent, or Firm* — Knobbe Martens Olson & Bear LLP

(57) ABSTRACT

Provided are an organic light-emitting display device and a manufacturing method of the organic light emitting display device. The organic light-emitting display device includes: a substrate; a display unit formed on the substrate; an encapsulation substrate formed above the display unit; a first sealant bonding the substrate and the encapsulation substrate; a filler formed between the substrate and the encapsulation substrate; and a second sealant interposed between the first sealant and the filler so as to separate the filler from the first sealant, wherein a distance of a portion of the substrate and the encapsulation substrate is smaller than that of other portions of the substrate and the encapsulation substrate. Accordingly, penetration of impurities, such as oxygen or water, from the outside into the organic light emitting display device is prevented.

8 Claims, 5 Drawing Sheets

FOREIGN PATENT DOCUMENTS

| | | |
|---|---|---|
| JP | 2003-109750 | 4/2003 |
| JP | 2004319103 A * | 11/2004 |
| JP | 2005-332615 | 12/2005 |
| JP | 2007-073459 | 3/2007 |
| KR | 1020050024592 A | 3/2005 |
| KR | 1020070083154 A | 8/2007 |

* cited by examiner

ORGANIC LIGHT EMITTING DISPLAY DEVICE AND METHOD OF MANUFACTURING THEREOF

CROSS-REFERENCE TO RELATED PATENT APPLICATION

This application claims the benefit of Korean Patent Application No. 10-2008-0010756, filed on Feb. 1, 2008 in the Korean Intellectual Property Office, the disclosure of which is incorporated herein in its entirety by reference.

BACKGROUND OF THE INVENTION

1. Field of the Invention

The present embodiments relate to an organic light-emitting display device and a method of manufacturing the same, and more particularly, to an organic light emitting display apparatus for which penetration of external impurities such as oxygen or water into an organic light emitting display device is prevented, and a method of manufacturing the organic light emitting display device.

2. Description of the Related Art

Display devices are being replaced with portable, thin flat panel display devices. Among the flat panel display devices, an electroluminescent display device, which is a self-emissive display device, has a wide viewing angle and high contrast ratio, and also high response speed, thus being noticed as a next-generation display device. In addition, an organic light-emitting display device having a light emitting layer formed of an organic material has improved properties in terms of brightness, driving voltage, and response speed, and can realize multiple colors in comparison to an inorganic light emitting display device.

FIG. 1 is a cross-sectional view of a conventional organic light emitting display device. Referring to FIG. 1, a display unit 20 is formed on a substrate 10, and an encapsulation substrate 30 is formed above the display unit 20 such that the substrate 10 and the encapsulation substrate 30 are attached to each other using a sealant 41.

A flat panel display unit included in a flat panel display device, particularly, an organic light emitting device may be deteriorated by internal factors such as deterioration of a light emitting layer due to oxygen exposure with indium tin oxide (ITO) used as an electrode or deterioration due to reaction between a light emitting layer and an interface, as well as by external factors such as water, oxygen, ultraviolet rays from the outside, and the manufacturing conditions of the device. Particularly, oxygen and water from the outside affect the life span of the device, and thus packaging of the organic light emitting device is critical.

However, in the case of the conventional organic light-emitting display device, as illustrated in FIG. 1, impurities such as oxygen or water from the outside may penetrate into the organic light-emitting display device through interfaces between the sealant 41 and the encapsulation substrate 30 and thus damage the display unit 20.

In order to solve this problem and prevent damage due to impacts, in the conventional art, a method of further forming a filling film (not shown) or a filler (not shown) between the substrate 10 and the encapsulation substrate 30 and further disposing a dam (not shown) between the sealant 41 and the filling film or the filler has been developed.

However, when such a process of further filling a filling material between the substrate 10 and the encapsulation substrate 30 is employed, irremovable bubbles are generated, thereby increasing the number of defected products.

SUMMARY OF THE INVENTION

The present embodiments provide an organic light-emitting display device and a method of manufacturing the same, and, as a result, bubbles generated in a filling material are removed to thus increase the manufacturing process yield of organic light-emitting display devices.

According to an aspect of the present embodiments, there is provided an organic light-emitting display device comprising: a substrate; a display unit formed on the substrate; an encapsulation substrate formed above the display unit; a first sealant bonding the substrate and the encapsulation substrate; a filler formed between the substrate and the encapsulation substrate; and a second sealant interposed between the first sealant and the filler so as to separate the filler from the first sealant, wherein a distance of a portion of the substrate and the encapsulation substrate is smaller than that of other portions of the substrate and the encapsulation substrate.

A first distance in a region between the substrate and the encapsulation substrate, where the filler is formed, may be smaller than a second distance in a region between the substrate and the encapsulation substrate, where the filler is not formed.

A first thickness in a center portion of the filler may be smaller than a second thickness in an edge portion of the filler.

The first thickness may be 95% or less than the second thickness.

The volume of the filler formed between the substrate and the encapsulation substrate may be smaller than the volume of a space formed by the substrate, the encapsulation substrate, and the second sealant.

The volume of the filler formed between the substrate and the encapsulation substrate may be 60-95% of the volume of the space formed by the substrate, the encapsulation substrate, and the second sealant.

The filler may be formed to fill a space between the substrate and the encapsulation substrate.

The filler may be formed to cover the display unit.

According to another aspect of the present embodiments, there is provided a method of manufacturing an organic light emitting device, the method comprising: forming a display unit on a surface of a substrate; providing an encapsulation substrate; forming a first sealant on the surface of the substrate; forming a second sealant interior to the first sealant, on the substrate; filling a filler having a smaller volume than the volume of a space formed by the substrate, the encapsulation substrate, and the second sealant, interior to the second sealant on the substrate; and bonding the substrate and the encapsulation substrate to each other using the first sealant.

The filling of a filler may comprise filling a filler having a volume of 60-95% of the volume of the space formed by the substrate, the encapsulation substrate, and the second sealant.

A distance of a portion of the substrate and the encapsulation substrate may be smaller than other portions of the substrate and the encapsulation substrate due to the filler having a smaller volume than the volume of the space formed by the substrate, the encapsulation substrate, and the second sealant.

A first distance in a region between the substrate and the encapsulation substrate, where the filler is formed may be smaller than a second distance in a region between the substrate and the encapsulation substrate, where the filler is not formed due to the filler having a smaller volume than the volume of the space formed by the substrate, the encapsulation substrate, and the second sealant.

A first thickness in a center portion of the filler may be smaller than a second thickness in an edge portion of the filler due to the filler having a smaller volume than the volume of the space formed by the substrate, the encapsulation substrate, and the second sealant.

The first thickness may be 95% or less than the second thickness.

In the filling of a filler, the filler may fill the space between the substrate and the encapsulation substrate.

In the filling of the filler, the filler may cover the display unit.

The bonding of the substrate and the encapsulation substrate may be performed at a pressure of 100 torr or less.

The substrate and the encapsulation substrate may be bonded to each other using the first sealant, bubbles generated in the filler are discharged to the outside of the organic light emitting display device.

The substrate and the encapsulation substrate may be bonded to each other using the first sealant, the encapsulation substrate is curved inward with a predetermined curvature.

According to the above-described organic light-emitting display device and the manufacturing method of the same, bubbles generated in a filling material are removed, thereby increasing the manufacturing process yield of organic light-emitting display devices.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

The present embodiments will now be described more fully with reference to the accompanying drawings, in which exemplary embodiments are shown.

Figure 1:
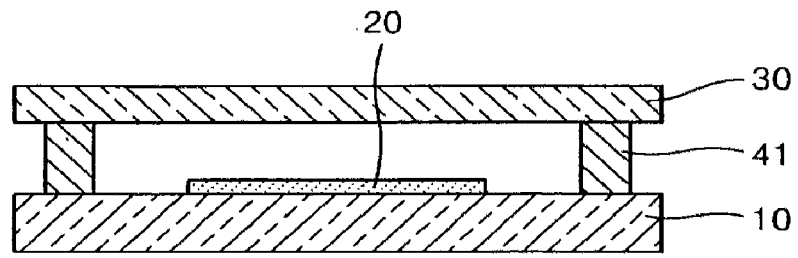
FIG. 1 is a cross-sectional view of a conventional organic light emitting display device.
Figure 2:
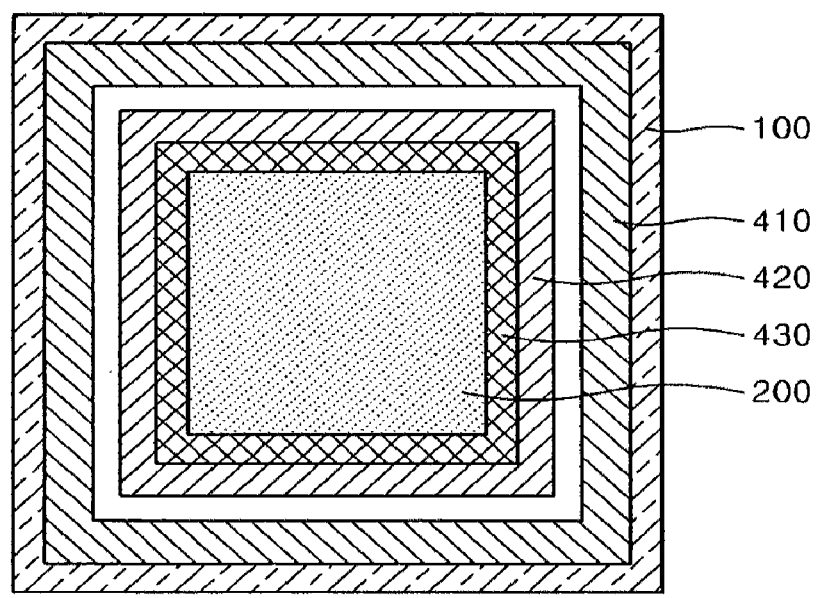
FIG. 2 is a plane view of a portion of an organic light-emitting display device according to an embodiment.
Figure 3:
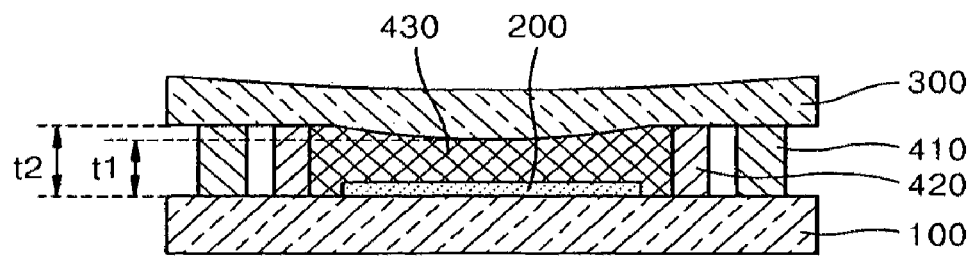
FIG. 3 is a cross-sectional view of the organic light-emitting display device of FIG. 2.

FIG. 2 is a plan view of a portion of an organic light-emitting display device according to an embodiment, and FIG. 3 is a cross-sectional view of the organic light-emitting display device of FIG. 2. In FIG. 2, an encapsulation substrate 300 illustrated in FIG. 3 is removed.

Referring to FIGS. 2 and 3, a display unit 200 formed as an organic light emitting device is formed on a substrate 100.

The substrate 100 may be formed, for example, of a transparent material such as glass containing $SiO_2$ as a main component, but is not limited thereto and thus may also comprise a transparent plastic material that may be an insulating organic material selected from the group consisting of polyethersulphone (PES), polyacrylate (PAR), polyetherimide (PEI), polyethyelene napthalate (PEN), polyethylene terephthalate (PET), polyphenylene sulfide (PPS), polyallylate, polyimide, polycarbonate (PC), triacetate cellulose (TAC), and cellulose acetate propionate (CAP).

In a bottom emission type organic light-emitting display device in which an image is realized toward the substrate 100, the substrate 100 is preferably formed of a transparent material. However, in a top emission type organic light-emitting display device in which an image is realized away from the substrate 100, the substrate 100 may not be necessarily formed of a transparent material, and, in this case, the substrate 100 may comprise a metal. When the substrate 100 is formed of a metal, the substrate 100 may include at least one material selected from the group consisting of carbon, iron, chromium, manganese, nickel, titanium, molybdenum, stainless steel (SUS), Invar Alloys® (ArcelorMittal Stainless & Nickel Alloys, S.A., Clichy, France), Inconel® alloys (Special Metals Corp., New Hartford, N.Y.), and Kovar® alloys (Carpenter Technology Corp., Wyomissing, Pa.), but is not limited thereto and for example, the substrate 100 may also comprise a metal foil.

Although not illustrated in the drawing, a buffer layer may be further formed on a top surface of the substrate 100 to planarize of the substrate 100 and prevent penetration of impurities into the bottom emission type organic light-emitting display device.

The substrate 100, including the display unit 200, is attached to an encapsulation substrate 300 that is disposed above the display unit 200. The encapsulation substrate 300 may also comprise not only a transparent material such as glass, but also of various plastic materials such as acryl, and furthermore, a metal.

The substrate 100 and the encapsulation substrate 300 are attached to each other using a first sealant 410. The first sealant 410 may be a sealing glass frit, as generally used in the art.

Meanwhile, a filler 430 is formed interior to the first sealant 410, that is, the filler 430 is filled in a space between the substrate 100 and the encapsulation substrate 300 so as to surround the display unit 200. Examples of the filler 430 include organic sealants such as urethane resin, acrylic resin, or inorganic sealants. Examples of the urethane resin include urethane acrylates, and examples of the acrylic resin include butyl acrylate, ethylhexyl acrylate, etc.

Meanwhile, a second sealant 420 is formed between the first sealant 410 and the filler 430, as a dam for separating the first sealant 410 and the filler 430; the second sealant 420 is formed interior to the first sealant 410, so as to be separated from the first sealant 410 by a predetermined distance.

The second sealant 420 may comprise an organic sealant, an inorganic sealant, or a mixture of the organic and inorganic sealants.

The organic sealant may comprise at least one material selected from the group consisting of acrylic resin, methacrylic resin, polyiroprene, vinylic resin, epoxy resin, urethane resin, and cellulose resin. Examples of the acrylic resin include butylacrylate, ethylhexyl acrylate, etc. Examples of the methacrylic resin include propylene glycol methacrylate, tetrahydropyran-free methacrylate, etc. Examples of the vinylic resin include vinyl acetate and N-vinyl pyrrolidone. Examples of the epoxy resin include cycloaliphatic epoxide. Examples of the urethane resin include urethane acrylates. Examples of the cellulose resin include cellulose nitrate.

Examples of the inorganic sealant include metals such as silicon, aluminium, titanium, zirconium, and metal compounds such as metal oxides, for example, titanium dioxide, silicon oxide, zirconia, and alumina.

An organic/inorganic hybrid binder is a material in which a non-metal or metal such as silicon, aluminium, titanium, zirconium, etc. is covalently bonded to an organic material. The organic/inorganic hybrid binder may be at least one material selected from the group consisting of epoxy silane and its derivative, a vinyl silane and its derivative, amine silane and its derivative, methacrylate silane, and a resultant material of a partial hardening reaction of these. Examples of the epoxy silane and its derivative include 3-glycidoxypropyltrimethoxysilane and its polymer. Examples of the vinyl silane and its derivative include vinyltriethoxysilane and its polymer. Also, examples of the amine silane and its derivative include 3-aminopropyltriethoxysilane and its polymer. Examples of the methacrylate silane and its derivative include 3-(trimethoxysilyl)propyl acrylate and its polymer.

In the organic light emitting display device, a portion of a distance between the substrate 100 and the encapsulation substrate 300 is formed to be smaller than another portion of the distance between the substrate 100 and the encapsulation substrate 300.

As described above, the display unit 200 including the organic light emitting device is vulnerable to oxygen or water from the outside, and thus penetration of these impurities from the outside into the inside of the organic light emitting display device needs to be prevented. In order to solve this problem and prevent damage due to impacts, a filler is further formed between a substrate and an encapsulation substrate and a second sealant is further disposed between the filler and the first sealant to separate the filler and the first sealant from each other. However, in such an internal filling process of further interposing the filler between the substrate and the encapsulation substrate, irremovable bubbles can be generated, and the number of defective products increases. To solve this problem, according to the current embodiment, the thickness of a center portion of the filler formed between the substrate and the encapsulation substrate is smaller than the thickness of an edge portion of the filler.

As described above, a thickness t1 of a center portion of the filler 430 formed between the substrate 100 and the encapsulation substrate 300 is formed to be smaller than a thickness t2 in an edge portion of the filler 430. The thickness t2 of the edge portion of the filler 430 is substantially the same as the thicknesses of the first sealant 410 or the second sealant 420.

The thickness t1 of the center portion of the filler 430 may be formed to be approximately 95% or less than the thickness t2 of the edge portion of the filler 430.

The thickness t1 of the center portion of the filler 430 is formed to be smaller than the thickness t2 of the edge portion of the filler 430 because the volume of the filler 430 formed between the substrate 100 and the encapsulation substrate 300 is smaller than the volume of a space formed by the substrate 100, the encapsulation substrate 300, and the second sealant 420, that is, the space in which the filler 430 is accommodated.

The filler 430 having a volume smaller than the volume of the space formed by the substrate 100, the encapsulation substrate 300, and the second sealant 420 is filled in the space formed by the substrate 100, the encapsulation substrate 300, and the second sealant 420, and thus then the substrate 100 and the encapsulation substrate 300 can be attached to each other. Here, a predetermined pressure is applied by above the encapsulation substrate 300 to attach the substrate 100 and the encapsulation substrate 300. Accordingly, the thickness t2 in the edge portion of the filler 430 supported by the first sealant 410 and the second sealant 420 is maintained regularly, but the center portion of the filler 430 is pressed due to the applied pressure, and thus the thickness t1 of the center portion of the filler 430 is decreased.

Thus, when the encapsulation substrate 300 is attached to the filler 430 after the filler 430 having a smaller volume than the volume of the space accommodating the filler 430 is filled in such space, the center portion of the filler 430 is pressed to a small degree as the attachment is processed from the center portion toward the edge portion, whereby bubbles generated in the filler 430 are pushed to the outside to thus be able to be easily removed.

Here, the volume of the filler 430 filled in the space formed by the substrate 100, the encapsulation substrate 300, and the second sealant 420, that is, the space accommodating the filler 430, may preferably be from about 60 to about 95% of the volume of the space accommodating the filler 430 for the following reasons.

The pressure applied by above the encapsulation substrate 300 may be 100 torr or less because, if a pressure greater than such is applied, a predetermined internal pressure is generated, and thus bubbles generated in the filler 430 may not be able to escape to the outside. Also, the filler 430 may not be uniformly distributed due to the internal pressure.

Figure 4A:
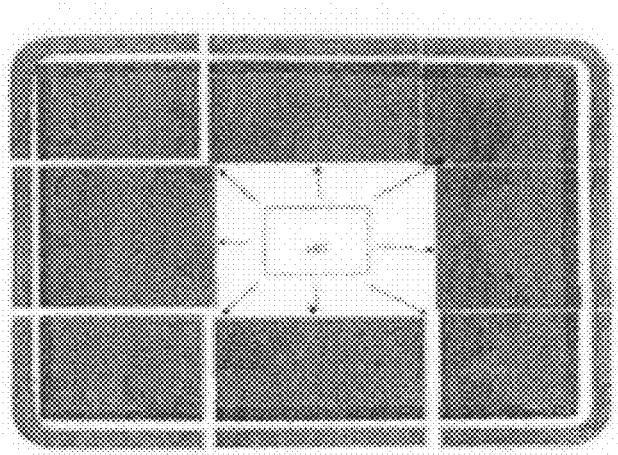
FIGS. 4A through 4C are plane views of an organic light-emitting display device in which a filler having a predetermined volume is filled and pressurized at a predetermined pressure, according to exemplary embodiments.
Figure 4B:
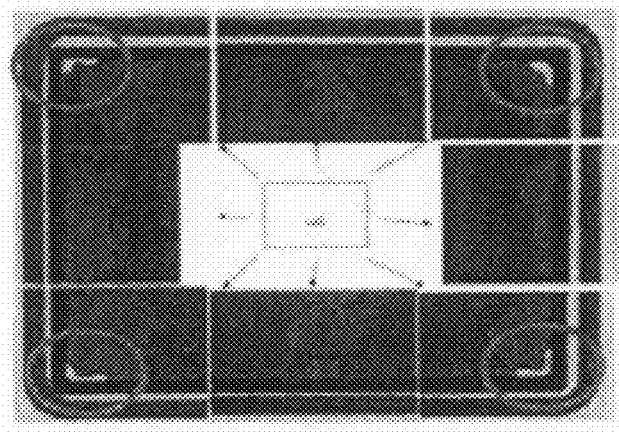
Figure 4C:
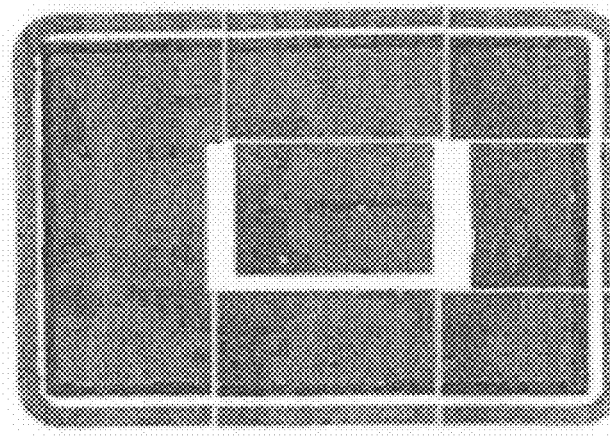

FIGS. 4A through 4C are plane views of an organic light-emitting display device in which a filler having a predetermined volume is filled and pressurized at a predetermined pressure, according to embodiments.

FIG. 4A illustrates an organic light-emitting display device in which a filler is filled from about 60 to about 95% in a space formed by a substrate, an encapsulation substrate, and a second sealant and pressurized at a pressure of about 100 torr or less. In this case, as illustrated in FIG. 4A, bubbles in the filler can be removed completely.

On the other hand, FIG. 4B illustrates an organic light-emitting display device in which a filler is filled 100% in the space formed by a substrate, an encapsulation substrate, and a second sealant and pressurized at a pressure of 100 torr or less. In this case, the space accommodating the filler is filled completely, and thus the feature, or, the difference in the thicknesses of the center portion and the edge portion of the filler is not easily realized, and thus bubbles generated in the filler 430 are not easily removed.

Meanwhile, FIG. 4C illustrates an organic light-emitting display device in which a filler is filled from about 60 to about 95% in a space formed by a substrate, an encapsulation substrate, and a second sealant, and pressurized at a pressure of about 110 torr. In this case, as illustrated in FIG. 4C, a predetermined internal pressure is generated, and thus bubbles generated in the filler cannot escape to the outside and at the same time the filler is not uniformly distributed due to the internal pressure.

As described above, according to the present embodiments, bubbles generated in the filler can be removed and thus a manufacturing process yield can be increased.

Figure 5:
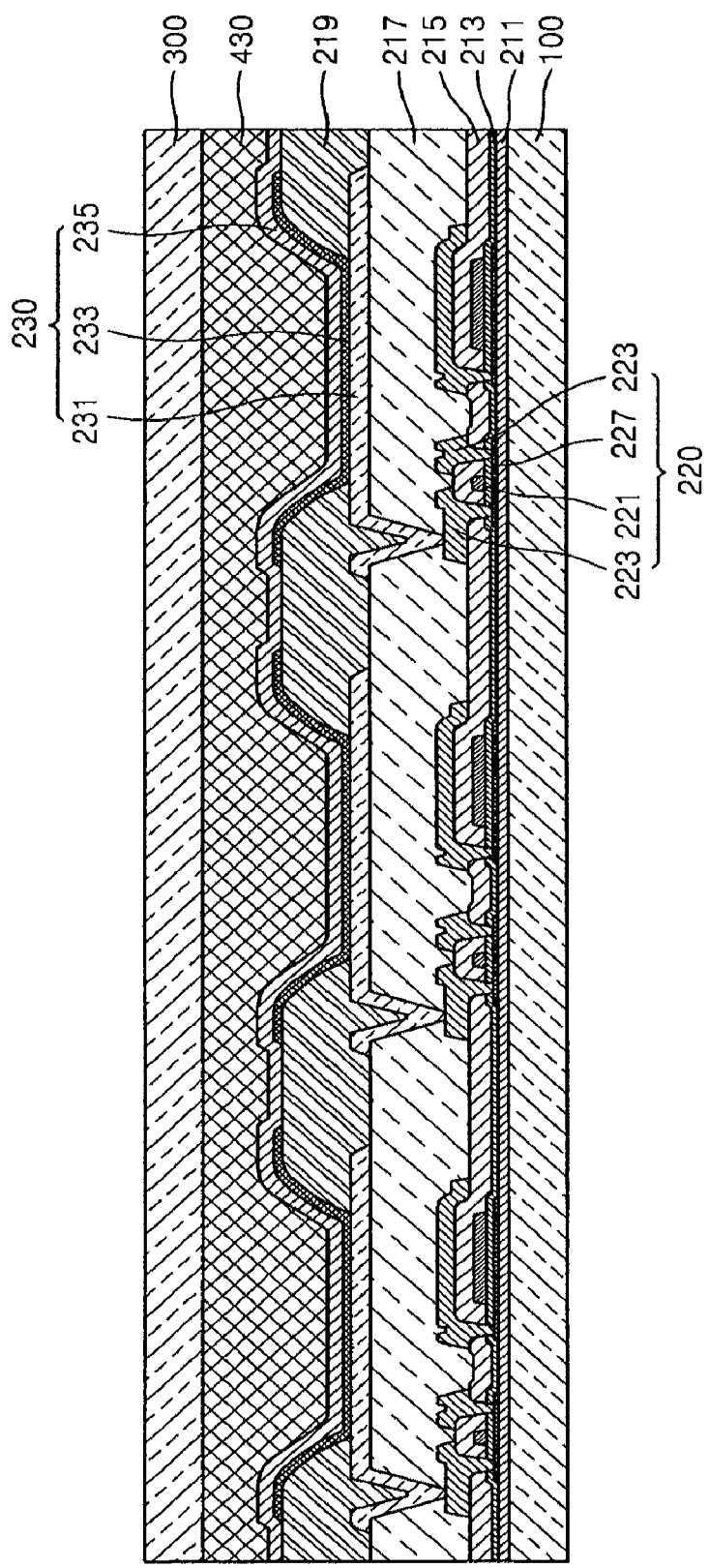
FIG. 5 is a cross-sectional view of a portion of the organic light-emitting display device of FIG. 2.

FIG. 5 is a cross-sectional view of a portion of the organic light-emitting display device of FIG. 2, showing a detailed configuration of the display unit 200.

Referring to FIG. 5, a plurality of thin film transistors 220 are formed on the substrate 100, and an organic light emitting device 230 is formed on each of the thin film transistors 220 such that the organic light emitting device 230 includes a pixel electrode 231 electrically connected to the thin film transistor 220, a counter electrode 235 disposed overall on the substrate 100, and an intermediate layer 233 disposed between the pixel electrode 231 and the counter electrode 235 and including at least a light emitting layer.

The thin film transistors 220, each including a gate electrode 221, source and drain electrodes 223, a semiconductor layer 227, a gate insulating layer 213, and an interlayer insulating layer 215, are formed on the substrate 100. Obviously, the present embodiment is not limited to the thin film transistors 220 of FIG. 5, and thus other various thin film transistors such as an organic thin film transistor including a semiconductor layer formed of an organic material or a silicon thin film transistor formed of silicon may also be used. A buffer layer 211 formed of a silicon oxide or a silicon nitride may be further formed between the thin film transistors 220 and the substrate 100 according to necessity.

The intermediate layer 233, including at least a light emitting layer, may also include a plurality of layers as described later.

The pixel electrode 231 functions as an anode and the counter 235 functions as a cathode electrode, or vice versa.

The pixel electrode 231 may be formed as a transparent electrode or a reflective electrode. When formed as a transparent electrode, the pixel electrode 231 may comprise, for example, indium tin oxide (ITO), indium zinc oxide (IZO), ZnO, or $In_2O_3$. When formed as a reflective electrode, the pixel electrode 231 may include a reflection layer formed of Ag, Mg, Al, Pt, Pd, Au, Ni, Nd, Ir, Cr or compound of any of these, and a layer, formed of ITO, IZO, ZnO, or $In_2O_3$, formed on the reflection layer.

The counter electrode 235 may also be formed as a transparent electrode or a reflective electrode. When formed as a transparent electrode, the counter electrode 235 may include a layer in which Li, Ca, LiF/Ca, LiF/Al, Al, Mg, or a compound of any of these is deposited toward the intermediate layer 233 between the pixel electrode 231 and the counter electrode 235, and may also include a bus electrode line and an auxiliary electrode formed of ITO, IZO, ZnO, or $In_2O_3$. When formed of a reflective electrode, the counter electrode 235 may be formed by depositing Li, Ca, LiF/Ca, LiF/Al, Al, Mg or a compound of any of these.

Also, a pixel defining layer (PDL) 219 is formed to cover the edge of the pixel electrode 231 and to have a predetermined thickness away from the pixel electrode 231. Besides the function of defining a light emitting region, in the edge portion of the PDL 219, the counter electrode 235 is spaced apart from the pixel electrode 231 by a distance corresponding to the thickness of the PDL 219 located therebetween. Accordingly, a centralized electric field on the edge portion of the pixel electrode 231 is prevented, thereby preventing a short circuit between the pixel electrode 231 and the counter electrode 235.

A plurality of intermediate layers 233 including at least a light emitting layer may be formed between the pixel electrode 231 and the counter electrode 235. In the present embodiment, the intermediate layer 233 may be comprised of, for example a low molecule organic material or a polymer organic material.

When formed of a low molecule organic material, the intermediate layer 233 may have a single-layer or multiple-layer structure in which a hole injection layer (HIL), a hole transport layer (HTL), an organic light emission layer (EML), an electron transport layer (ETL), and an electron injection layer (EIL) are stacked. Examples of the organic material include copper phthalocyanine (CuPc), N,N'-Di(naphthalene-1-yl)-N,N'-diphenyl-benzidine (NPB), tris-8-hydroxyquinoline aluminum (Alq3), etc. The low molecule organic material may be formed using a vacuum deposition method using masks.

When formed of a polymer organic material, the intermediate layer 233 may have a structure formed of an HTL and an EML; the HTL may be comprised of, for example poly(3,4-ethylenedioxythiophene) (PEDOT), and the EML may be comprised of, for example poly-phenylenevinylene (PPV) and polyfluorene.

The organic light emitting device 230 is electrically connected to the thin film transistor 220 disposed therebelow; when a planarization layer 217 covering the thin film transistor 220 is formed, the organic light emitting device 230 is disposed on the planarization layer 217, and the pixel electrode 231 of the organic light emitting device 230 is electrically connected to the thin film transistor 220 via contact holes formed in the planarization layer 217.

Also, the organic light emitting device 230 formed on the substrate 100 is sealed by the encapsulation substrate 300. The encapsulation substrate 300 may comprise various materials such as glass or plastic, as described above.

Also, the filler 430 is formed between the organic light emitting device 230 and the encapsulation substrate 300 to fill a space therebetween, thereby preventing exfoliation or breakage of cells of the organic light emitting device 230.

In the above described structure, the first sealant 410 is formed along the edge of the encapsulation substrate 300 or to cover the display unit 200, and the second sealant 420 is formed interior to the first sealant 410 so as to separate the first sealant 410 and the filler 430 from each other, and thus penetration of impurities into the organic light-emitting display device 230 and damage to the display unit 200 can be efficiently prevented.

FIGS. 6A through 6E are cross-sectional views for describing a method of manufacturing an organic light-emitting display device, according to an embodiment.

Referring to FIGS. 6A through 6E, the method of manufacturing an organic light-emitting display device includes forming a display unit on a surface of a substrate, providing an encapsulation substrate, forming a first sealant on the surface of the substrate, forming a second sealant interior to the first sealant, filling a filler having a smaller volume than the volume of a space formed by the substrate, the encapsulation substrate, and the second substrate such that the filler is formed interior to the second sealant, and bonding the substrate and the encapsulation substrate to each other using the first sealant.

Figure 6A:
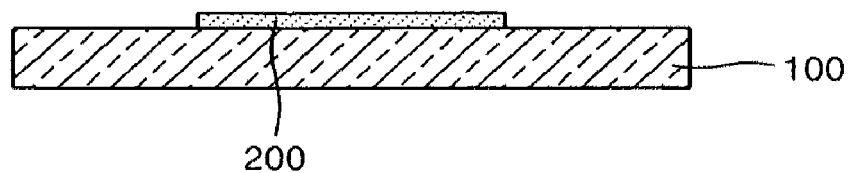
FIGS. 6A through 6E are cross-sectional views for describing a method of manufacturing an organic light-emitting display device, according to an embodiment.

First, as illustrated in FIG. 6A, the display unit 200 is formed on a surface of the substrate 100. The substrate 100 may be formed as a glass substrate, or various plastic substrates such as acryl, or furthermore, a metal substrate. The substrate 100 may further include a buffer layer (not shown) when necessary.

Next, the encapsulation substrate 300 is provided. The encapsulation substrate 300 may also be formed as a glass substrate, or various plastic substrates such as acryl, or furthermore, a metal substrate.

Figure 6B:
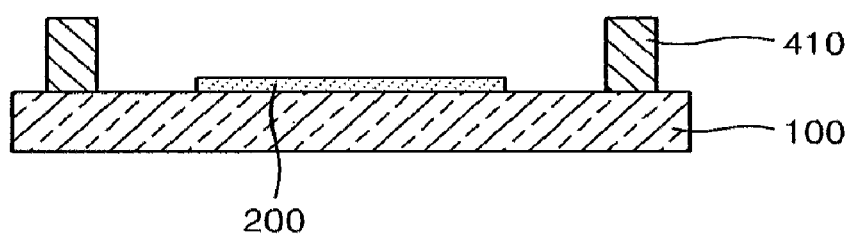

Next, as illustrated in FIG. 6B, the first sealant 410 is formed on the surface of the substrate 100. The first sealant 410 may comprise generally used material such as sealing glass frit.

Figure 6C:
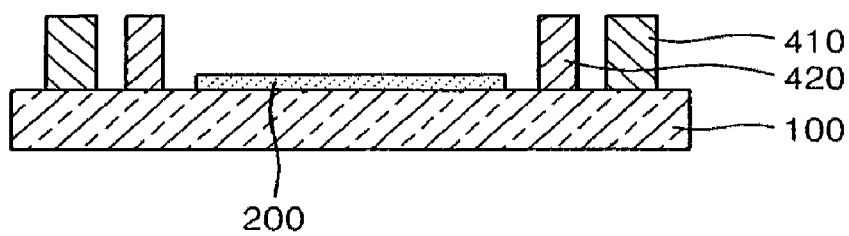

Next, as illustrated in FIG. 6C, the second sealant 420 is formed interior to the first sealant 410 of the substrate 100. The second sealant 420 functions as a dam for separating the first sealant 410 and the filler 430 from each other. In detail, the second sealant 420 is formed interior to the first sealant 410, so as to be separated from the first sealant 410 by a predetermined distance. The second sealant 420 may comprise an organic sealant, an inorganic sealant, an organic/inorganic hybrid sealant, or a mixture of these.

Figure 6D:
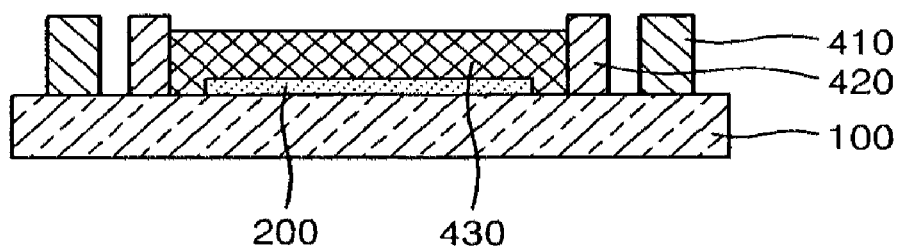

Next, as illustrated in FIG. 6D, interior to the second sealant 420 of the substrate 100, that is, in a space formed by the substrate 100, the encapsulation substrate 300, and the second sealant 420, in which the filler 430 is accommodated, the filler 430 having a volume smaller than the volume of the space is filled.

Here, the volume of the filler 430 filled in the space formed by the substrate 100, the encapsulation substrate 300, and the second sealant 420, that is, the space accommodating the filler 430, may preferably be from about 60 to about 90% of the volume of the space accommodating the filler 430 for the following reasons.

Figure 6E:
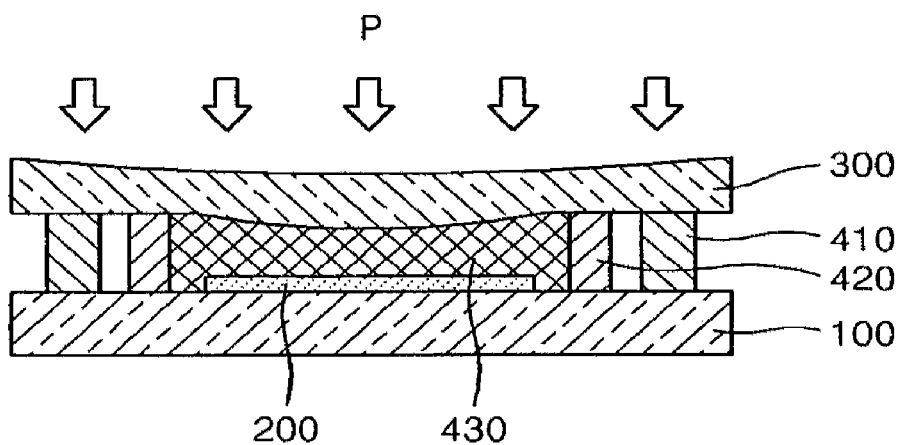

Finally, as illustrated in FIG. 6E, the substrate 100 and the encapsulation substrate 300 are bonded to each other using the first sealant 410. That is, the first sealant 410 is hardened by partially irradiating laser to the first sealant 410, with a laser irradiator, and thus, bond the substrate 100 and the encapsulation substrate 300.

Here, in order to attach the substrate 100 and the encapsulation substrate 300, a predetermined pressure is applied by above the encapsulation substrate 300. As also shown in FIG. 6, a thickness t2 on the edge portion of the filler 430 is maintained regular, but a thickness t1 on the inner portion of the filler 430 is decreased because the inner portion of the filler 430 is pressed due to the applied pressure.

As described above, as the filler 430 having a smaller volume than the volume of the space accommodating the filler 430 is filled in the space accommodating the filler 430, and the encapsulation substrate 300 and the filler 430 are attached to each other using the first sealant 410, the attachment of the filler 430 is processed from the center portion to the edge portion of the filler 430, and thus bubbles generated in the filler 430 are pushed to the edge portion and can be easily removed accordingly.

The predetermined pressure applied by above the encapsulation substrate 300 may preferably be about 100 torr or less because when a pressure greater than such pressure is applied, a predetermined internal pressure is generated, and thus bubbles generated in the filler 430 may not be able to escape to the outside. Also, the filler 430 may not be uniformly distributed due to the internal pressure.

Thus, when the filler 430 and the encapsulation substrate 300 are attached using a predetermined pressure, the thickness t1 in the center portion of the filler 430 disposed between the substrate 100 and the encapsulation substrate 300 is less than the thickness t2 in the edge portion of the filler 430. The thickness t2 of the filler 430 in the edge portion is substantially the same as the thicknesses of the first sealant 410 or the second sealant 420. The thickness t1 in the center portion of the filler 430 may be formed to be approximately 95% or less than the thickness t2 in the edge portion of the filler 430.

As described above, according to the present embodiments, the manufacturing process yield can be increased by removing the bubbles generated in the filler.

While the present embodiments have been particularly shown and described with reference to exemplary embodiments thereof, it will be understood by one of ordinary skill in the art that various changes in form and details may be made therein without departing from the spirit and scope of the present embodiments as defined by the following claims.

What is claimed is:

1. An organic light-emitting display device comprising:
 a substrate;
 a display unit comprising one or more electrodes formed on the substrate;
 an encapsulation substrate formed above the display unit;
 a first sealant configured to bond the substrate and the encapsulation substrate;
 an insulating filler contacting the one or more electrodes and the substrate and formed between the substrate and the encapsulation substrate; and
 a second sealant interposed between the first sealant and the filler so as to separate the filler from the first sealant,
 wherein the distance between a portion of the substrate and the encapsulation substrate is smaller than of the distance between other portions of the substrate and the encapsulation substrate; and
 wherein the insulating filler comprises at least one selected from the group consisting of a urethane resin, an acrylic resin, an inorganic sealant, a urethane acrylate, a butyl acrylate and an ethylhexyl acrylate.

2. The organic light-emitting display device of claim 1, wherein a first distance in a region between the substrate and the encapsulation substrate, where the filler is formed, is smaller than a second distance in a region between the substrate and the encapsulation substrate, where the filler is not formed.

3. The organic light-emitting display device of claim 1, wherein a first thickness in a center portion of the filler is smaller than a second thickness in an edge portion of the filler.

4. The organic light-emitting display device of claim 3, wherein the first thickness is about 95% or less than the second thickness.

5. The organic light-emitting display device of claim 1, wherein the volume of the filler formed between the substrate and the encapsulation substrate is smaller than the volume of a space formed by the substrate, the encapsulation substrate, and the second sealant.

6. The organic light-emitting display device of claim 5, wherein the volume of the filler formed between the substrate and the encapsulation substrate is from about 60 to about 95% of the volume of the space formed by the substrate, the encapsulation substrate, and the second sealant.

7. The organic light-emitting display device of claim 1, wherein the filler is formed to fill the space between the substrate and the encapsulation substrate.

8. The organic light-emitting display device of claim 7, wherein the filler is formed to cover the display unit.

\* \* \* \* \*